United States Patent [19]

Aono et al.

[11] Patent Number: 5,521,429
[45] Date of Patent: May 28, 1996

[54] SURFACE-MOUNT FLAT PACKAGE SEMICONDUCTOR DEVICE

[75] Inventors: Tsutomu Aono; Takayoshi Nishi, both of Gunma-ken, Japan

[73] Assignee: Sanyo Electric Co., Ltd., Osaka, Japan

[21] Appl. No.: 344,424

[22] Filed: Nov. 23, 1994

[30] Foreign Application Priority Data

Nov. 25, 1993 [JP] Japan .................................. 5-295720
Nov. 25, 1993 [JP] Japan .................................. 5-295721

[51] Int. Cl.⁶ .......................... H01L 23/28; H01L 23/36
[52] U.S. Cl. ...................... 257/676; 257/666; 257/796; 257/675; 257/706; 257/775
[58] Field of Search .................................. 257/666, 625, 257/675, 706, 707, 717, 726, 796, 676, 775

[56] References Cited

U.S. PATENT DOCUMENTS

| 4,460,917 | 7/1984 | Rogers | 257/717 |
| 4,750,030 | 6/1988 | Hatakeyama | 257/675 |

FOREIGN PATENT DOCUMENTS

| 0124249 | 9/1981 | Japan | 257/796 |
| 0139949 | 8/1982 | Japan | 252/796 |
| 0137238 | 8/1983 | Japan | 257/720 |
| 0188857 | 11/1987 | Japan | 257/720 |
| 0137464 | 6/1988 | Japan | 257/676 |
| 0293553 | 11/1989 | Japan | 257/675 |
| 0166979 | 2/1993 | Japan | 257/675 |
| 0090464 | 4/1993 | Japan | . |
| 0124972 | 5/1994 | Japan | 257/675 |
| 0043849 | 3/1995 | Japan | 257/675 |

Primary Examiner—Robert P. Limanek
Assistant Examiner—Alexander Oscar Williams
Attorney, Agent, or Firm—Christopher R. Pastel; Thomas R. Morrison

[57] ABSTRACT

A surface mount flat package for a semiconductor device includes a number of leads on a lead frame. At least one of the leads is straight with a thick section and a thin section. Part of the thin section is inside a protective medium and part extends outside. A bottom surface of the part extending outside the protective medium serves as a connection terminal for the semiconductor device. Another lead is an island lead that has a bonding island on an upper surface thereof. The island lead has a thick section and a thin section. The bonding island is on the thin section. The thin section is entirely within the protective medium. A bottom surface of the thick section is exposed outside the protective medium to serve as a connection terminal. The bottom surfaces of the thick sections are coplanar with each other and preferably coplanar with a bottom surface of the package.

26 Claims, 4 Drawing Sheets

SURFACE-MOUNT FLAT PACKAGE SEMICONDUCTOR DEVICE

BACKGROUND OF THE INVENTION

The present invention relates to a surface-mount flat package semiconductor device that is compact and is able to avoid short-circuits between terminals.

In the manufacture of integrated circuits, a semiconductor chip or device is connected to internal contacts in a package. The package provides external contacts for the circuitry as well as protection from the environment. In a conventional wire bonding process, the semiconductor chip is first mounted on a metal lead frame or on a metallized region of an insulating substrate using a process known as die-bonding. Once the chip is mounted, the interconnecting wires are attached from the various contact pads of the chip to posts on the metal lead frame. These posts are either connected to the leads or are part of the leads themselves. The final step is packaging the device in a suitable medium to protect it from the environment. Ceramics, glasses, and various resins are commonly used for this purpose.

The most widely used package types are the radial-lead type, the flat package, and the dual-in-line (DIP) package. Flat packages generally use metal-lead flames combined with ceramic, glass, plastic, and metal components. The flat package was developed to improve on the volume, weight, and pin-count limitations of the radial-lead type of package. The flat package generally has about one-fifth the volume and one tenth the weight of a radial-lead package. The flat package has the advantages of light weight and small volume, and a large die area compared with package size. The major disadvantages are high cost and difficulty in handling.

In a prior art device (Japanese Laid-open Patent Application 3-249695), improved compactness and thinness in a flat package is achieved with a surface-mount semiconductor package having posts or leads formed in a Z-shape extending from resin so that the posts or leads contact a conductive pattern on a printed circuit board.

Referring to FIGS. 6A–6B, a cross-sectional view and a bottom plan view of a prior art surface-mount flat package are shown. Contact pads (not shown) on a die-bonded semiconductor chip 1 and a plurality of leads 2 are connected by wires 3. Semiconductor chip 1 is then packaged in a resin package 4. Leads 2 extending from resin package 4 are bent in a "Z" shape so that the end of each lead 2 is parallel to the bottom surface of resin package 4. Bends 5 in each lead 2 are outside resin package 4.

In order to provide increased mounting density for parts on a circuit board, further compactness is desirable. Referring to FIGS. 7A–7B, a more compact surface mount package according to the prior art includes leads 2 having bends 5 within resin package 4. By having bend 5 within resin package 4 instead of outside resin package 4 as in FIGS. 6A–6B, the distance that leads 2 extend away from resin package 4 is reduced. The soldering portion at the tips of leads 2 are close to resin package 4. This permits a higher density for the conductor pattern on the printed circuit board.

Referring now to FIGS. 8A–8B, another embodiment of the prior art exposes the bottom surfaces of leads 2 on the bottom surface of resin package 4 so that a part of each lead 2 is eliminated. As in FIGS. 7A–7B, the soldering portion at the tips of leads 2 are close to resin package 4. This permits a higher density for the conductor pattern on a printed circuit board. Since the configuration in FIGS. 8A–8B does not require bends 5 in leads 2, higher processing precision is possible, and thus improved compactness, compared to the configurations in FIGS. 6A–6B and FIGS. 7A–7B. However, the distances between inner portions of leads 2 are small since leads 2 are exposed on the bottom surface of resin package 4. This makes the device prone to short circuits caused by excess solder used during the mounting process.

OBJECTS AND SUMMARY OF THE INVENTION

It is an object of the present invention to overcome these drawbacks of the prior art by providing a package that is compact and avoids short circuits between terminals.

A further object of the present invention is to provide a package that maximizes the distance between exposed leads, avoids bent leads, and is compact.

Briefly stated, a surface mount flat package for a semiconductor device includes a number of leads on a lead frame. At least one of the leads is straight and has a thick section and a thin section. Part of the thick section is inside a protective medium and part extends outside. A bottom surface of the part extending outside the protective medium serves as a connection terminal for the semiconductor device. Another lead is an island lead that has a bonding island on an upper surface thereof. The island lead has a thick section and a thin section. The bonding island is on the thin section. The thin section is entirely within the protective medium. A bottom surface of the thick section is exposed outside the protective medium to serve as a connection terminal. The bottom surfaces of the thick sections are coplanar with each other and preferably coplanar with a bottom surface of the package.

According to an embodiment of the invention, a surface-mount flat package for a semiconductor device includes a plurality of leads, at least one of the leads being straight and having a lead thick section and a lead thin section, at least an other one of the leads being an island lead having a bonding island on an upper surface thereof, the island lead having an island lead thick section and an island lead thin section, a first portion of the lead thick section being inside a protective medium, a second portion of the lead thick section being outside the protective medium to serve as an external connection terminal for the semiconductor device, a bottom surface of the second portion being exposed outside a bottom surface of the protective medium, the lead thin section being inside the protective medium, and the island lead thin section being inside the protective medium.

According to a feature of the invention, the bonding island is over the island lead thin section.

According to another feature of the invention, a bottom surface of the island lead thick section and a bottom surface of the lead thick section are coplanar with a bottom surface of the package.

According to another embodiment of the invention, a surface-mount flat package for a semiconductor device includes a plurality of leads on a lead frame, at least one of the leads being straight and having a lead thick section and a lead thin section, at least an other one of the leads being an island lead having a bonding island on an upper surface thereof, the island lead having an island lead thick section and an island lead thin section, a first portion of the lead thick section inside a protective medium, a heat sink in the island lead thick section, a second portion of the lead thick section outside the protective medium whereby the second portion serves as an external connection terminal for the semiconductor device, a bottom surface of the second portion being exposed outside a bottom surface of the protective medium, the lead thin section being inside said protective medium, and the island lead thin section being inside the protective medium.

According to another embodiment of the invention, a surface-mount flat package for a semiconductor device includes a plurality of leads on a lead frame, at least one of the leads being straight and having a lead thick section and a lead thin section, at least an other one of the leads being an island lead having a bonding island on an upper surface thereof, the island lead having an island lead thick section and an island lead thin section, the island lead thick section being outside a protective medium, a bottom surface of the island lead thick section serving as an external connection terminal for the semiconductor device, a first portion of the lead thin section inside the protective medium, a second portion of the lead thin section outside the protective medium, the lead thick section being outside the protective medium, and a bottom surface of the lead thick section serving as an external connection terminal for the semiconductor device.

According to another embodiment of the invention, a surface-mount flat package for a semiconductor device includes a plurality of leads on a lead frame, at least one of the leads being straight and having a lead thick section and a lead thin section, at least an other one of the leads being an island lead having a bonding island on an upper surface thereof, the island lead having an island lead thick section and an island lead thin section, a heat sink in the island lead thick section, a bottom surface of the island lead thick section serving as an external connection terminal for the semiconductor device, a first portion of the lead thin section inside the protective medium, a second portion of the lead thin section outside the protective medium, the lead thick section being outside the protective medium, and a bottom surface of the lead thick section serving as an external connection terminal for the semiconductor device.

According to another embodiment of the invention, a surface-mount flat package for a semiconductor device includes a plurality of leads on a lead frame, at least one of the leads being straight and having a lead thick section and a lead thin section, at least an other one of the leads being an island lead having a bonding island on an upper surface thereof, the island lead having first and second island lead thick sections and an island lead thin section, a heat sink in the first island lead thick section, a bottom surface of the second island lead thick section serving as an external connection terminal for the semiconductor device, a first portion of the lead thin section inside a protective medium, a second portion of the lead thin section outside the protective medium, the lead thick section being outside the protective medium, and a bottom surface of the lead thick section serving as an external connection terminal for the semiconductor device.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

The following factors define the limits in the miniaturization of a surface-mount flat package:

(a) the size of a die to be mounted,
(b) the size of bonding islands within the package, taking into consideration the precision required in positioning the die,
(c) the processing precision required for a lead frame,
(d) the distance between leads, and
(e) the bonding area required for a wire bond.

Further considerations include a necessary contact area between an insulating medium and the leads to prevent the leads from working loose or the insulating medium from peeling away from the leads, a thickness of the insulating medium required to maintain humidity resistance, and a path length of the leads.

Figure 1A:
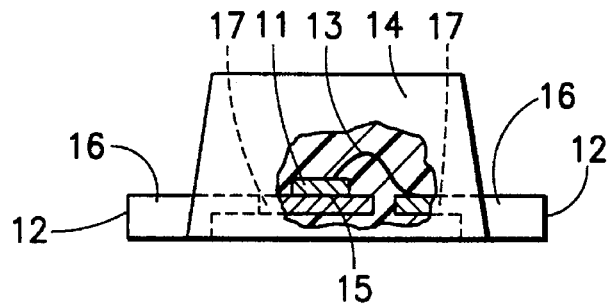
FIG. 1A is a cross-sectional view of a first embodiment of the present invention.
Figure 1B:
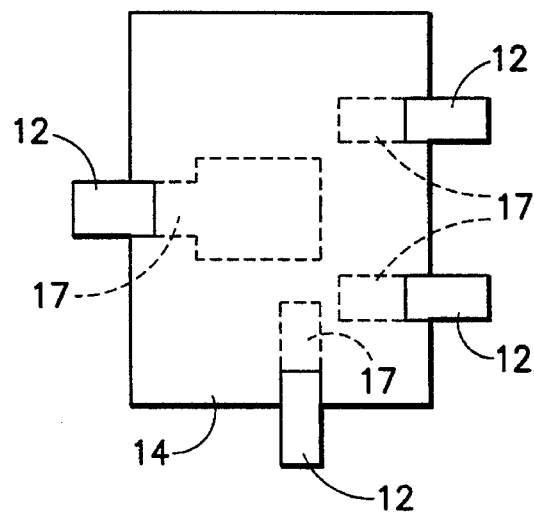
FIG. 1B is a bottom plan view of the first embodiment of the present invention.

Referring to FIGS. 1A–1B, a semiconductor chip 11 such as, for example, a transistor chip, a diode chip, or the like, is die-bonded on a lead frame (not shown) in a bonding island 15. A plurality of leads 12, originally part of the lead frame, lead away from the island area. A contact pad (not shown) formed on a surface of semiconductor chip 11 is wire bonded to a corresponding lead 12 with a wire 13. In this embodiment, each lead 12 is made from a material having areas with different thicknesses. As a result, each lead 12 has a thick section 16 and a thin section 17. As an example, and not as a limitation, the thickness of thick section 16 is about 0.5 mm and the thickness of thin section 17 is about 0.2 mm.

Figure 8A:
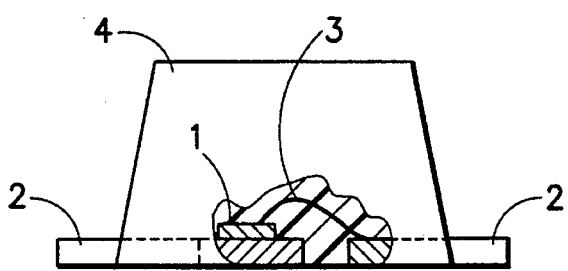
FIG. 8A is a cross-sectional view of a third prior art device.
Figure 8B:
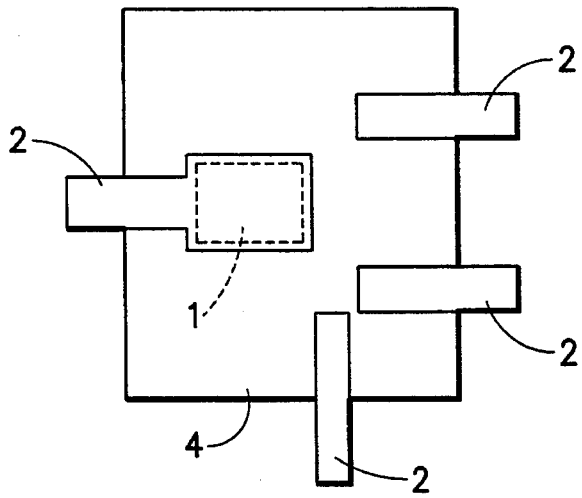
FIG. 8B is a bottom plan view of the prior art device of FIG. 8A.

Leads 12 remain flat, and unbent, when they are sealed in resin package 14. Thick sections 16 of leads 12 extend outside resin package 14 where they serve as external connection terminals. A bottom surface of each thick section 16 is exposed so that it lies in a common plane with a bottom surface of resin package 14. Thin section 17 is sealed within resin package 14, thereby sealing both an upper and lower surface of thin section 17. Since resin package 14 is an insulator, an exposed surface of leads 12 is limited to the bottom surface of thick section 16. The exposed surface of each lead 12 is thus shorter than an exposed surface of each lead 2 in the prior art of FIGS. 8A–8B by the length of thin section 17.

At locations where distances between leads 12 are shortest, leads 12 form thin sections 17. This minimizes the separation distance required when fabricating the metal-lead frame so that the separation distances are proportional to the widths of thin sections 17.

Since leads 12 in the package are not bent but instead remain flat, processing tolerances can be relaxed. Thus, limiting factor (c) above (lead frame processing precision) for miniaturization is improved, and the assembly process is simplified. In addition, the separation distance between leads is maximized, thus keeping limiting factor (d) above to a minimal value. Since a surface-mount flat package is mounted by adhering the bottom surfaces of leads 12 to a surface of an electrode pattern etched on a surface of a printed circuit board (not shown), the increased separation distance between leads 12 reduces short circuits caused by excess solder. Furthermore, the contact area between leads 12 and resin package 14 is increased. This permits lead 12 to have sufficient adhesive strength and humidity resistance without increasing the overall size of the package. Thus, this embodiment of the present invention provides a package having improved compactness.

Figure 2A:
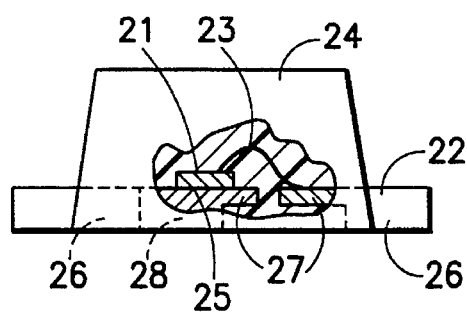
FIG. 2A is a cross-sectional view of a second embodiment of the present invention.
Figure 2B:
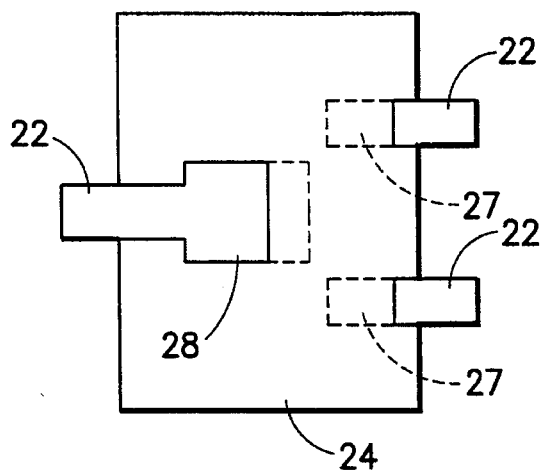
FIG. 2B is a bottom plan view of the second embodiment of the present invention.

Referring to FIGS. 2A–2B, a second embodiment of the present invention is shown which includes a built-in heat sink 28 for a semiconductor chip 21. For applications in which power elements radiating a certain amount of heat are surface mounted, improved heat dissipation is provided by this embodiment. A semiconductor chip 21 is die-bonded on a lead frame (not shown) in a bonding island 25. A plurality of leads 22, originally part of the lead frame, lead away from the island area. A contact pad (not shown) on a surface of semiconductor chip 21 is wire bonded to a corresponding lead 22 with a wire 23.

Each lead 22 includes a thick section 26 and a thin section 27. Leads 22 are not bent and are sealed in a resin package 24 while flat. Thick sections 26 of leads 22 extend outside resin package 24 where they serve as external connection terminals. Bottom surfaces of thick sections 26 are exposed to lie in a common plane with a bottom surface of resin package 24. Thin section 27 is sealed within resin package 24, thereby sealing both an upper and lower surface of thin section 27. Since resin package 24 is an insulator, an exposed surface of leads 22 is limited to the bottom surface of thick section 26. The exposed surface of each lead 22 is thus shorter than an exposed surface of each lead 2 in the prior art of FIGS. 8A–8B by the length of thin section 27.

Heat sink 28 serves to increase the heat dissipation capacity of the semiconductor chip 21. Heat sink 28 is in close contact with the electrode pattern exposed from resin package 24 to increase heat dissipation. The bottom surface of thick section 26 is separated from heat sink 28 by the length of thin section 27. The separation distance between terminals is increased over the prior art.

Although the above embodiments depict three-terminal packages, it is fully within the contemplation of the invention to employ the disclosed invention to produce devices having any convenient number of terminals, such as, for example, four-terminal and six-terminal packages. It is also possible to implement packages comprising two heat sinks 28 in the same resin package 24.

Figure 3A:
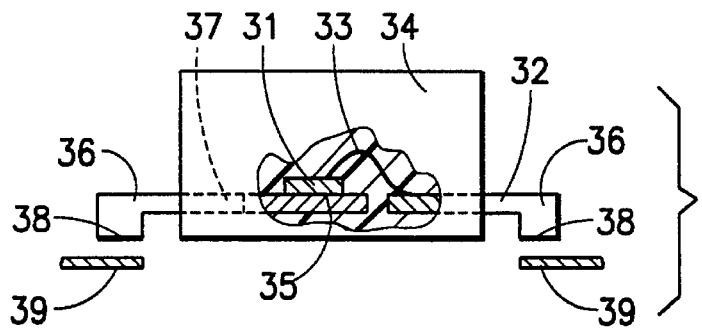
FIG. 3A is a cross-sectional view of a third embodiment of the present invention.
Figure 3B:
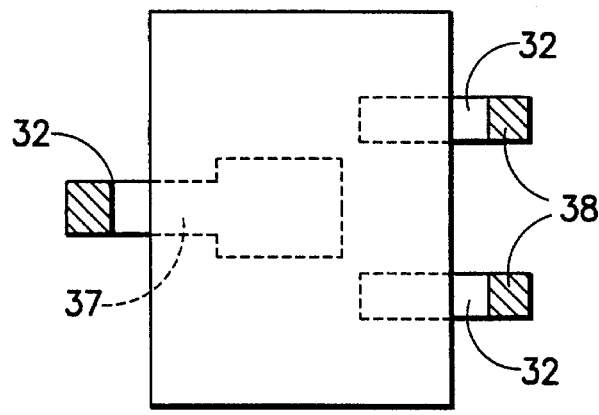
FIG. 3B is a bottom plan view of the third embodiment of the present invention.

Referring to FIGS. 3A–3B, a semiconductor chip 31 is die-bonded on a lead frame (not shown) in a bonding island 35. A plurality of leads 32 on the lead frame lead away from bonding island 35. A contact pad (not shown) on a surface of semiconductor chip 31 is wire bonded to a corresponding lead 32 with a wire 33.

Each lead 32 has a thick section 36 and a thin section 37. The thickness of thick section 36 is, for example, about 0.5 mm, while the thickness of thin section 37 is about 0.2 mm. Leads 32 remain unbent when they are sealed by resin package 24. Thick sections 36 of leads 32 are entirely outside resin package 34 where they serve as external connection terminals. A portion of thin section 37 is sealed within resin package 34. Remainders of thin sections 37 extend outside resin package 34. The separation distance between terminals is increased over the prior art.

Solder connection surface 38, formed by bottom surfaces of thick sections 36, lie in a common plane with a bottom surface of resin package 34. Since thick sections 36 are spaced outward from resin package 34, solder connection surface 38 is also spaced outward from resin package 34. Solder connection surface 38 is connected to an electrode pattern 39 on a printed circuit board (not shown). Thus, electrode pattern 39 etched on the surface of the printed circuit board only needs to be formed with sufficient accuracy to enable making contact with thick sections 36. Short-circuits of leads 32 caused by solder flowing over the surface of resin package 34 are prevented. In addition, since there is no solder on the bottom surface of resin package 34, there is no lifting of the package due to solder bumps. Even if some solder bumps are formed, the thicknesses of the bumps can be compensated for by resilience in thin sections 37.

Figure 4A:
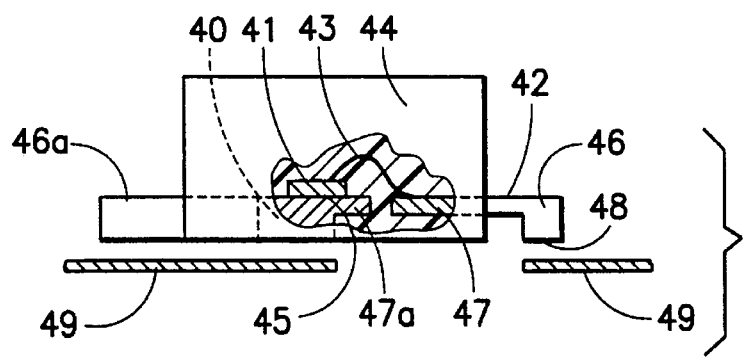
FIG. 4A is a cross-sectional view of a fourth embodiment of the present invention.
Figure 4B:
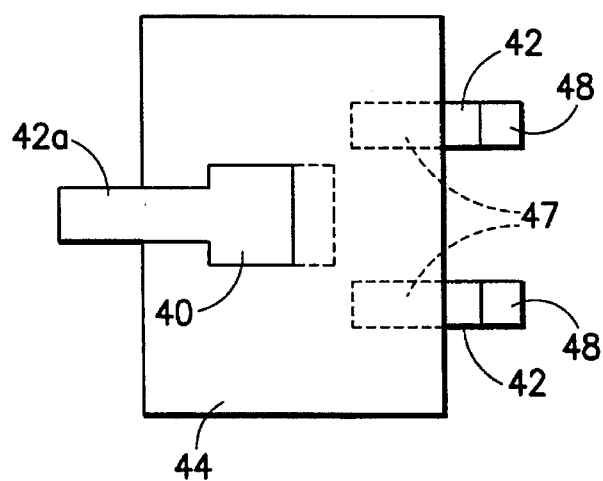
FIG. 4B is a bottom plan view of the fourth embodiment of the present invention.

Referring to FIGS. 4A–4B, a fourth embodiment of the present invention modifies the third embodiment with a built-in heat sink 40. Surface-mount applications in which power elements generate a substantial amount of heat require special attention to dissipating the heat outside the resin package. A semiconductor chip 41 is die-bonded on a lead frame (not shown) in a bonding island 45. A plurality of leads 42 on the lead frame extend from bonding island 45. A contact pad (not shown) on a surface of semiconductor chip 41 is wire bonded to a corresponding lead 42 with a wire 43. Bonding island 45 is integrally formed with an island lead 42a.

Each lead 42 includes a thick section 46 and a thin section 47. Island lead 42a have thick sections 46a and thin sections 47a. Island lead 42a and leads 42 remain unbent when they are sealed by resin package 44. Thick sections 46 of leads 42, lying entirely outside resin package 44, serve as external connection terminals. A portion of thin section 47 is sealed within resin package 44, and a remainder extends outside resin package 44. The separation distance between terminals is increased over the prior art.

Solder connection surface 48 is a bottom surface of thick sections 46 which defines a plane that is coplanar with a bottom surface of resin package 44. Since thick sections 46 are separated from resin package 44, solder connection surface 48 is also separated from resin package 44. Solder connection surface 48 is connected to an electrode pattern 49 on a printed circuit board (not shown). The accuracy of electrode pattern 49 on the surface of the printed circuit board needs only to be sufficient to make contact with thick section 46. Short-circuits of leads 42 caused by solder flowing over the surface of resin package 44 are prevented. In addition, since there is no solder on the bottom surface of resin package 44, there is no lifting of the package due to solder bumps. Even if some solder bumps are formed, the thickness of the bumps can be compensated for by the resilience of thin sections 47. A bottom surface of each thick section 46 is exposed so that it is coplanar with a bottom surface of resin package 44. Thin section 47 is sealed within resin package 44, thereby sealing both an upper and a lower surface of thin section 47. Since resin package 44 is an insulator, an exposed surface of lead 42 is limited to the bottom surface of thick section 46. The exposed surface of each lead 42 is thus shorter than an exposed surface of each lead 2 in the prior art of FIGS. 8A–8B by the length of thin section 47.

Thick section 46a extends from below bonding island 45 downwards to a bottom surface of resin package 44. Thick section 46a thus acts as a heat sink 40 to increase the heat absorbing and radiating capacity of semiconductor chip 41. Thick section 46a is in close thermal contact with electrode pattern 49 to increase heat dissipation.

This embodiment describes a three-terminal package, but packages with any convenient numbers of terminals can be made following the teachings of the present invention. For example, four-terminal, six-terminal or greater numbers of terminals may be produced without departing from the spirit and scope of the invention. It is also possible to implement a package having two or more heat sinks 48.

Figure 5A:
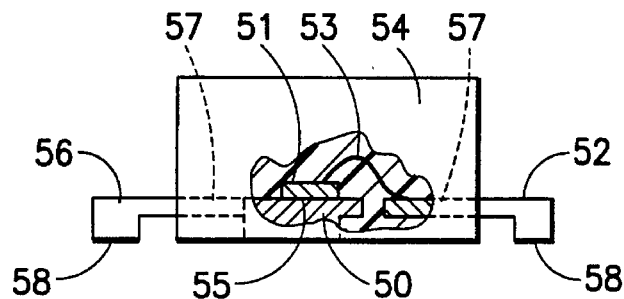
FIG. 5A is a cross-sectional view of a fifth embodiment of the present invention.
Figure 5B:
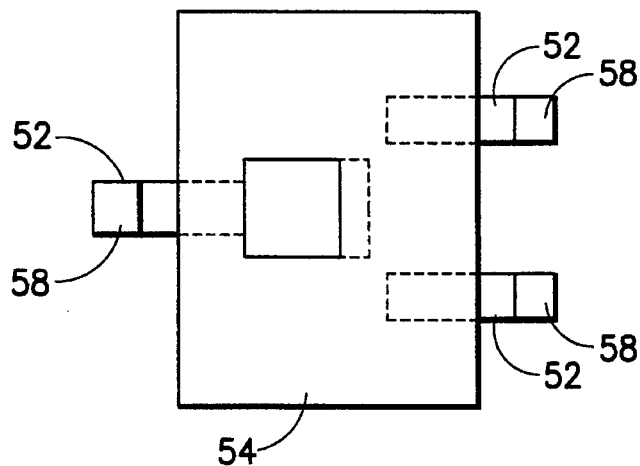
FIG. 5B is a bottom plan view of the fifth embodiment of the present invention.
Figure 6A:
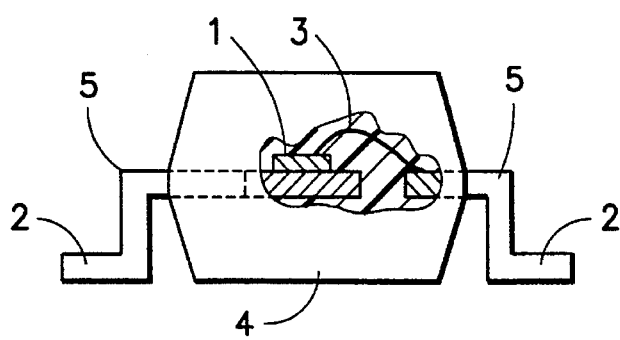
FIG. 6A is a cross-sectional view of a device according to the prior art.
Figure 6B:
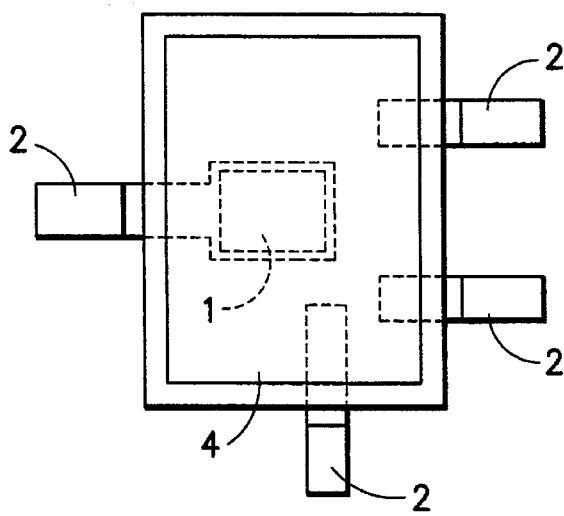
FIG. 6B is a bottom plan view of the prior art device of FIG. 6A.
Figure 7A:
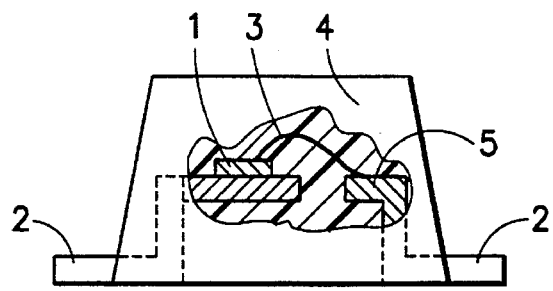
FIG. 7A is a cross-sectional view of a second prior art device.
Figure 7B:
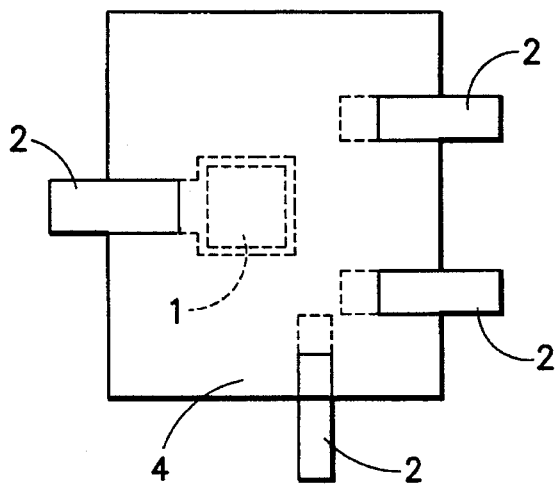
FIG. 7B is a bottom plan view of the prior art device of FIG. 7A.

Referring to FIGS. 5A–5B, a fifth embodiment is shown. A semiconductor chip 51 is die-bonded on a lead frame (not shown) in a bonding island 55. A plurality of leads 52 extend outward from the lead frame and away from bonding island 55. Contact pads (not shown) on a surface of semiconductor chip 51 are wire bonded to corresponding leads 52 with wires 53.

Each lead 52 has a thick section 56 and a thin section 57. The thickness of thick section 56 is, for example, about 0.5 mm, while the thickness of thin section 57 is about 0.2 min. Leads 52 remain unbent and flat when they are sealed by resin package 54. Thick sections 56 of leads 52 are entirely outside resin package 54 where they serve as external connection terminals. A portion of thin sections 57 are sealed within resin package 54. A remainder of thin sections 57 extend outside resin package 54. The separation distance between terminals is increased over the prior art.

A heat sink 50 under bonding island 55 extends downward to a bottom surface of resin package 50. If necessary, an additional heat sink area can be formed on the electrode pattern (not shown) in contact with heat sink 50 to provide even more heat dissipation.

Solder connection surface 58, on a bottom surface of thick section 56, is coplanar with a bottom surface of resin package 54. Since thick section 56 is separated from resin package 54, solder connection surface 58 is also separated from resin package 54. Solder connection surface 58 is connected to an electrode pattern (not shown) on a printed circuit board (not shown). The accuracy of the electrode pattern on the surface of the printed circuit board only needs to be sufficient to make contact with thick section 56. Short-circuits of leads 52 caused by solder flowing over the surface of resin package 54 are prevented. In addition, since there is no solder on the bottom surface of resin package 54, there is no lifting of resin package 54 due to solder bumps. Even if some solder bumps are formed, the thickness of the bump can be compensated for by the resilience of thin sections 57.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A surface-mount flat package for a semiconductor device, comprising:

a plurality of leads;

at least one of said leads being a straight lead and having a lead thick section and a lead thin section;

at least an other one of said leads being an island lead for receiving said semiconductor device on an upper surface thereof;

said upper surface of said island lead being coplanar with an upper surface of said straight lead;

said island lead having an island lead thick section and an island lead thin section;

a first portion of said lead thick section being inside a protective medium;

a second portion of said lead thick section being outside said protective medium to serve as an external connection terminal for said semiconductor device;

a bottom surface of said second portion being exposed outside a bottom surface of said protective medium;

said lead thin section being entirely inside said protective medium; and said island lead thin section being entirely inside said protective medium.

2. A package according to claim 1, wherein said semiconductor device is mounted substantially over said island lead thin section.

3. A package according to claim 1, wherein said leads are closest to each other at said lead thin sections.

4. A package according to claim 1, wherein said protective medium is one of resin, glass, and ceramic.

5. A package according to claim 1, wherein a bottom surface of said first portion is exposed outside a bottom surface of said protective medium.

6. A package according to claim 1, wherein a bottom surface of said island lead thick section and a bottom surface of said lead thick section are coplanar with a bottom surface of said package.

7. A surface-mount flat package for a semiconductor device, comprising:

a plurality of leads;

at least one of said leads being a straight lead and having a lead thick section and a lead thin section;

at least an other one of said leads being an island lead for receiving said semiconductor device on an upper surface thereof;

said upper surface of said island lead being coplanar with an upper surface of said straight lead;

said island lead having an island lead thick section and an island lead thin section;

a first portion of said lead thick section inside a protective medium;

a heat sink in said island lead thick section;

a second portion of said lead thick section outside said protective medium whereby said second portion serves as an external connection terminal for said semiconductor device;

a bottom surface of said second portion exposed outside a bottom surface of said protective medium;

said lead thin section being entirely inside said protective medium; and said island lead thin section being entirely inside said protective medium.

8. A package according to claim 7, wherein said semiconductor device is mounted substantially over said heat sink.

9. A package according to claim 7, wherein said leads are closest to each other at said lead thin sections.

10. A package according to claim 7, wherein said protective medium is one of resin, glass, and ceramic.

11. A package according to claim 7, wherein a bottom surface of said first portion is exposed outside a bottom surface of said protective medium.

12. A package according to claim 7, wherein a bottom surface of said heat sink is exposed outside a bottom surface of said protective medium.

13. A package according to claim 7, wherein a bottom surface of said island lead thick section and a bottom surface of said lead thick section are coplanar with a bottom surface of said package.

14. A surface-mount flat package for a semiconductor device, comprising:

a plurality of leads;

at least one of said leads being straight and having a lead thick section and a lead thin section;

at least an other one of said leads being an island lead for receiving said semiconductor device on an upper surface thereof;

said island lead having an island lead thick section and an island lead thin section;

said island lead thick section being outside a protective medium;

a bottom surface of said island lead thick section serving as an external connection terminal for said semiconductor device;

a first portion of said lead thin section inside said protective medium;

a second portion of said lead thin section outside said protective medium;

said lead thick section being outside said protective medium; and a bottom surface of said lead thick section serving as an external connection terminal for said semiconductor device.

15. A package according to claim 14, wherein said semiconductor device is mounted over said island lead thin section.

16. A package according to claim 14, wherein said protective medium is one of resin, glass, and ceramic.

17. A package according to claim 14, wherein a bottom surface of said island lead thick section and a bottom surface of said lead thick section are coplanar with a bottom surface of said package.

18. A surface-mount flat package for a semiconductor device, comprising:

a plurality of leads;

at least one of said leads being straight and having a lead thick section and a lead thin section;

at least an other one of said leads being an island lead for receiving said semiconductor device on an upper surface thereof;

said island lead having an island lead thick section and an island lead thin section;

a heat sink in said island lead thick section;

a bottom surface of said island lead thick section serving as an external connection terminal for said semiconductor device;

a first portion of said lead thin section inside said protective medium;

a second portion of said lead thin section outside said protective medium;

said lead thick section being outside said protective medium; and a bottom surface of said lead thick section serving as an external connection terminal for said semiconductor device.

19. A package according to claim 18, wherein said semiconductor device is mounted substantially over said heat sink.

20. A package according to claim 18, wherein said protective medium is one of resin, glass, and ceramic.

21. A package according to claim 18, wherein a bottom surface of said island lead thick section and a bottom surface of said lead thick section are coplanar with a bottom surface of said package.

22. A surface-mount flat package for a semiconductor device, comprising:

a plurality of leads;

at least one of said leads being straight and having a lead thick section and a lead thin section;

at least an other one of said leads being an island lead for receiving said semiconductor device on an upper surface thereof;

said island lead having first and second island lead thick sections and an island lead thin section;

a heat sink in said first island lead thick section;

a bottom surface of said second island lead thick section serving as an external connection terminal for said semiconductor device;

a first portion of said lead thin section inside a protective medium;

a second portion of said lead thin section outside said protective medium;

said lead thick section being outside said protective medium; and a bottom surface of said lead thick section serving as an external connection terminal for said semiconductor device.

23. A package according to claim 22, wherein said semiconductor device is mounted substantially over said heat sink.

24. A package according to claim 22, wherein said protective medium is one of resin, glass, and ceramic.

25. A package according to claim 22, wherein a bottom surface of said heat sink is exposed outside a bottom surface of said protective medium.

26. A package according to claim 22, wherein a bottom surface of said island lead thick section and a bottom surface of said lead thick section are coplanar with a bottom surface of said package.

* * * * *